United States Patent
Lu

(10) Patent No.: US 10,867,674 B1
(45) Date of Patent: Dec. 15, 2020

(54) ONE-TIME PROGRAMMABLE (OTP) ANTI-FUSE MEMORY CELL

(71) Applicant: Synopsys, Inc., Mountain View, CA (US)

(72) Inventor: Xiaojun Lu, Kanata (CA)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/430,919

(22) Filed: Jun. 4, 2019

Related U.S. Application Data

(60) Provisional application No. 62/680,005, filed on Jun. 4, 2018, provisional application No. 62/694,074, filed on Jul. 5, 2018.

(51) Int. Cl.
| | |
|---|---|
| *G11C 17/16* | (2006.01) |
| *G11C 14/00* | (2006.01) |
| *H01L 27/112* | (2006.01) |
| *G11C 17/18* | (2006.01) |
| *G11C 11/4094* | (2006.01) |

(52) U.S. Cl.
CPC ...... *G11C 14/0009* (2013.01); *G11C 14/0054* (2013.01); *G11C 17/16* (2013.01); *G11C 17/165* (2013.01); *G11C 17/18* (2013.01); *H01L 27/11206* (2013.01); *G11C 11/4094* (2013.01)

(58) Field of Classification Search
CPC .............................. G11C 17/16; G11C 17/165
USPC .................................................... 365/96, 104
See application file for complete search history.

(56) References Cited

U.S. PATENT DOCUMENTS

| | | | |
|---|---|---|---|
| 5,331,118 A | 7/1994 | Jensen | |
| 5,396,461 A | 3/1995 | Fukumoto | |
| 6,564,286 B2 | 5/2003 | Dacosta | |
| 6,667,902 B2 | 12/2003 | Peng | |
| 7,099,189 B1 | 8/2006 | Plants | |
| 7,277,348 B2* | 10/2007 | Peng | G11C 17/16 365/129 |
| 7,402,855 B2 | 7/2008 | Kurjanowicz | |
| 7,508,694 B2* | 3/2009 | Terzioglu | G11C 17/16 365/225.7 |

(Continued)

*Primary Examiner* — Son L Mai
(74) *Attorney, Agent, or Firm* — Sterne, Kessler, Goldstein & Fox P.L.L.C.

(57) ABSTRACT

A memory storage device is disclosed herein which having volatile memory cells and non-volatile memory cells. The memory storage device can be implemented within a portable electronic device. These portable electronic devices often load data from non-volatile memory cells into volatile memory cells, for example, upon powering up. Conventionally, portable electronic devices often include separate non-volatile memory storage devices and volatile memory storage devices which requires a significant amount of time to transfer data stored in non-volatile memory storage devices to the volatile memory storage devices. However, the memory storage device integrates the volatile memory cells and the non-volatile memory cells into a single integrated memory device. This direct writing of the data stored in the non-volatile memory cells into the volatile memory cells as disclosed herein significantly reduces time required to load data from the non-volatile memory cells to the volatile memory cells which can significantly speed up powering up of portable electronic devices.

20 Claims, 9 Drawing Sheets

(56) References Cited

U.S. PATENT DOCUMENTS

| | | | | |
|---|---|---|---|---|
| 7,864,602 B2 * | 1/2011 | Ito | ............................ | G11C 5/145 |
| | | | | 365/100 |
| 7,869,251 B2 * | 1/2011 | Venkatraman | .......... | G11C 17/18 |
| | | | | 365/104 |
| 8,363,451 B2 * | 1/2013 | Rao | ..................... | G11C 14/0018 |
| | | | | 365/148 |
| 8,592,942 B2 * | 11/2013 | Kodama | ................. | G11C 17/16 |
| | | | | 257/209 |
| 9,159,415 B2 * | 10/2015 | Cosemans | ............ | H01L 27/2436 |
| 9,214,465 B2 | 12/2015 | Wang | | |
| 9,653,177 B1 * | 5/2017 | Chen | ......................... | G11C 7/12 |
| 2010/0290271 A1 * | 11/2010 | Lung | ................... | G11C 11/5614 |
| | | | | 365/163 |

* cited by examiner

ONE-TIME PROGRAMMABLE (OTP) ANTI-FUSE MEMORY CELL

CROSS-REFERENCE TO RELATED APPLICATIONS

The present application claims the benefit of U.S. Patent Appl. No. 62/680,005, filed on Jun. 4, 2018, which is incorporated herein by reference in its entirety.

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

SPECIFICATION—DISCLAIMERS

In the following Background, Summary, and Detailed Description, headings should not be construed as necessarily limiting. In the following Background, Summary and Detailed Description, the citation or identification of any publication does not signify relevance or status as prior art for any of the claimed or described embodiments.

FIELD(S) OF TECHNOLOGY

This disclosure relates to the field of memory devices, including memory cells within the memory devices having volatile memory cells and non-volatile memory cells.

BACKGROUND

Advances in technology and engineering have allowed designers and manufacturers to offer more electronic devices to consumers with portable electronic devices, such as smart mobile phones to provide an example, becoming increasingly popular. These portable electronic devices are often designed and manufactured to be easily carried, so small size and light weight are generally preferred. As a result, batteries of these portable electronic devices, which are necessary for operation, are limited in size and can only provide limited power. For example, portable electronic devices routinely have to be charged daily with normal usage, and, even in stand by modes of operation, the batteries of these portable electronic devices can be discharged in a few days even without any user activity. In some situations, these portable electronic devices can be powered off when not in use to conserve their batteries. However, most users of these portable electronic devices avoid powering off their portable electronic devices because powering on these portable electronic devices can take several seconds, with some portable electronic devices taking minutes, to boot up with current technologies. Furthermore, to avoid long startup time, most users do not close applications executing on their portable electronic devices while not in use, which results in continuously power consumption by the refreshing operation of the dynamic random-access memory (DRAM) used by the applications in computing systems

SUMMARY

The claims signify a brief description of one or more of the innovations, embodiments, and/or examples found within this disclosure.

This disclosure describes a memory storage device having memory cells. The memory cells are arranged in rows and columns. Memory cells from among the rows are coupled to corresponding wordline pairs and memory cells are coupled to corresponding bitlines. At least one memory cell from includes a non-volatile memory cell, coupled to a first wordline from among a corresponding wordline pair, and a volatile memory cell, coupled to a second wordline from among the corresponding wordline pair and the corresponding bitline. The non-volatile memory cell maintains first data while not powered and the volatile memory cell maintains second data when powered.

This disclosure also describes a memory cell from among a memory array of a memory storage device. The memory cell includes a dynamic random-access memory (DRAM) cell having a transistor and a capacitor and a one-time programmable read-only memory (OTP-ROM) cell having an antifuse. The DRAM cell charges and/or discharges the capacitor in response to assertion of a first wordline to activate the transistor to write first data from a bitline into the DRAM cell and reads charge stored on the capacitor in response to assertion of the first wordline to read second data from the DRAM cell onto the bitline. The OTP-ROM cell is programmed to write third data in response to application of a programming voltage on a second wordline and reads charge stored on the capacitor in response to assertion of the second wordline to activate the anti-fuse to read fourth data from the OTP-ROM onto the bitline.

This disclosure further describes a memory cell from among a memory array of a memory storage device. The memory cell includes a volatile memory cell connected to a first wordline and a bitline and a non-volatile memory cell connected to a second wordline and the bitline. The volatile memory cell writes first data from the bitline into the non-volatile memory cell in response to assertion of the first wordline and reads second data from the non-volatile memory cell onto the bitline in response to assertion of the first wordline. The non-volatile is programmed to write third data into the non-volatile memory cell in response to assertion of the first wordline to form a signal pathway between the non-volatile memory cell and the bitline and application of a programming voltage on a second wordline, and reads fourth data from the non-volatile memory cell onto the bitline in response to assertion of the first wordline to form the signal pathway and assertion of the second wordline This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

DRAWINGS

The following Detailed Description, Figures, appended Additional Figures and appended Claims signify the nature and advantages of the innovations, embodiments and/or examples of the disclosure. All of the Figures signify innovations, embodiments, and/or examples of the disclosure for purposes of illustration only and do not limit the scope of the disclosure. Such Figures are not necessarily drawn to scale and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

Figure 7A:
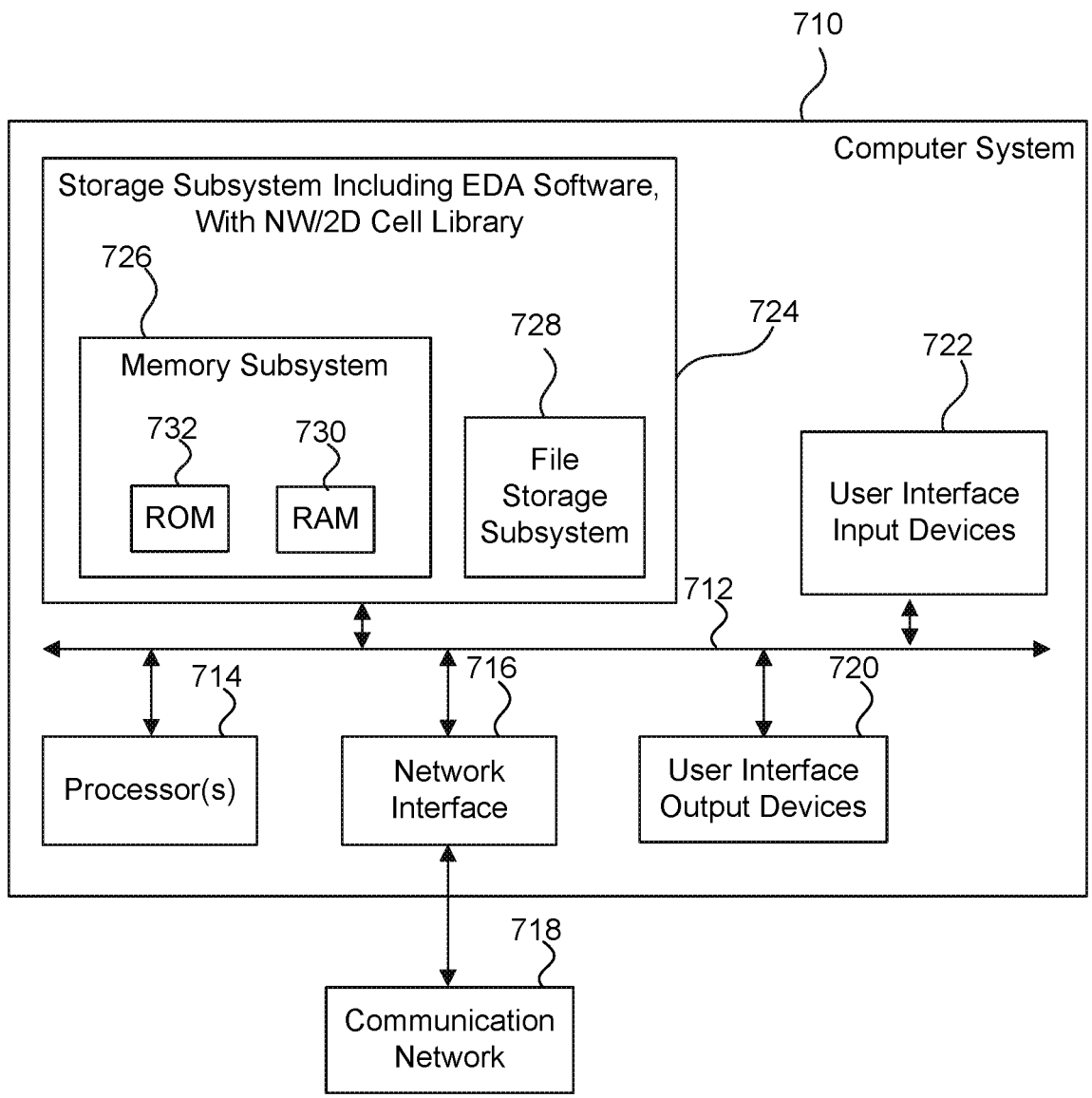
Figure 7B:
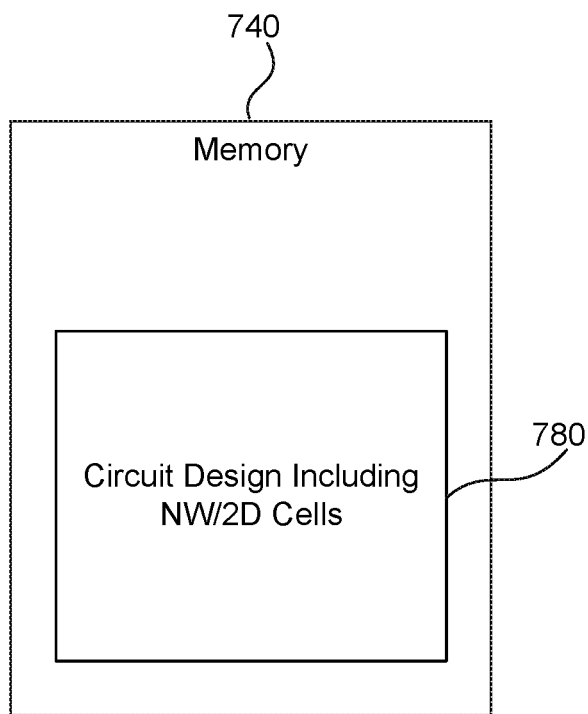
Figure 7C:
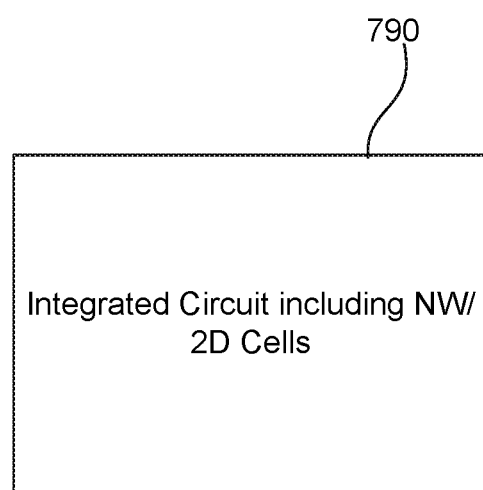
Figure 8:
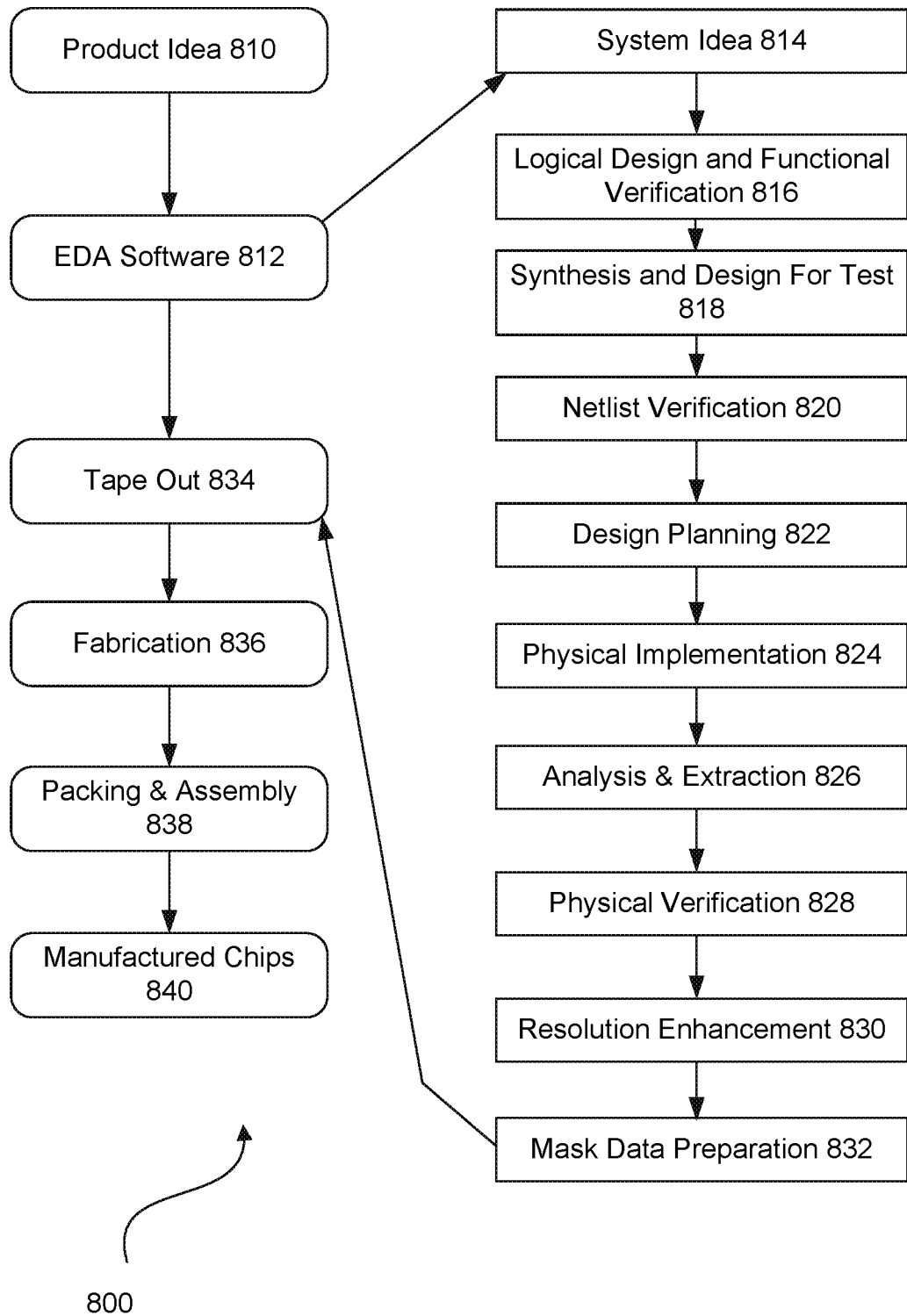

FIGS. 7A, 7B and 7C are simplified block diagrams of a computer system suitable for use with embodiments of the technology, as well as circuit design and circuit embodiments of the technology; and FIG. 8 illustrates various processes performed in the design, verification and fabrication of an item of manufacture such as an integrated circuit using software tools with a computer, and possibly special hardware-assisted tools, to transform and verify design data and instructions that represent the integrated circuit.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

DETAILED DESCRIPTION—EXEMPLARY MEMORY STORAGE Device

Figure 1:
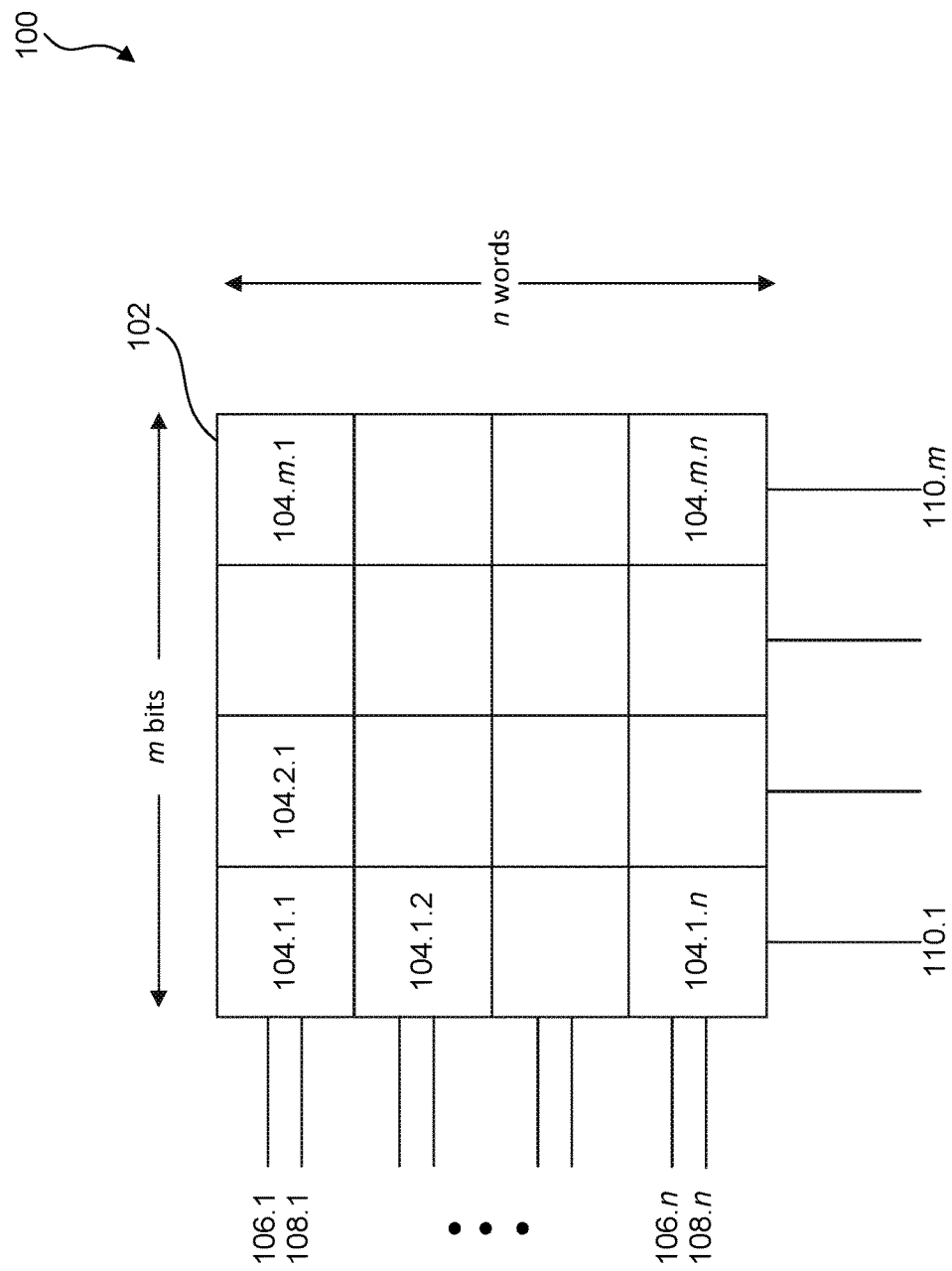
FIG. 1 illustrates a block diagram of a memory storage device according to an exemplary embodiment of the present disclosure.

FIG. 1 illustrates a block diagram of a memory storage device according to an exemplary embodiment of the present disclosure. In the exemplary embodiment illustrated in FIG. 1, a memory storage device 100 can include one or more memory cells having one or more volatile memory cells and/or one or more non-volatile memory cells. Herein, the term "volatile memory" refers to hardware, firmware, software, or any combination thereof which maintains its data while powered and the term "non-volatile memory" refers to hardware, firmware, software, or any combination thereof which maintains its data even when not powered. Those skilled in the relevant art(s) will recognize the memory cells of the memory storage device 100 can be implemented using volatile memory cells only, non-volatile memory cells only, both volatile memory cells and non-volatile memory cells, and/or any combination thereof without departing from the spirit and scope of the present disclosure. As to be described in further detail below, those memory cells from among the memory cells of the memory storage device 100 implemented using volatile memory cells and non-volatile memory cells can be specially purposed to perform volatile and non-volatile memory functions. This inclusion of the volatile memory cells and the non-volatile memory cells within the memory storage device 100 advantageously allows the memory storage device 100 to significantly reduce loading time of data from various non-volatile memory cells into various volatile memory cells implemented within the memory storage device 100.

The memory storage device 100 can be implemented in hardware, firmware, software, or any combination thereof. Moreover, the memory storage device 100 can also be implemented as instructions stored on a machine-readable medium, which can be read and executed by one or more processors. A machine-readable medium can include any mechanism for storing or transmitting data in a form readable by a machine (e.g., a computing device). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc. Moreover, the memory storage device 100 can include other hardware, firmware, software, or any combination thereof, such as a row-address decoder and/or a column-address decoder to provide some examples, which will be apparent to those skilled in the relevant art(s) without departing from the spirit and scope of the present disclosure.

As illustrated in FIG. 1, the memory storage device 100 includes a memory array 102 having memory cells 104.1.1 through 104.m.n that are configured into a series of m columns and a series of n rows to form an array. However, other arrangements for the memory cells 104.1.1 through 104.m.n are possible without departing from the spirit and scope of the present disclosure. As illustrated in FIG. 1, the memory cells 104.1.1 through 104.m.n are coupled to corresponding non-volatile wordlines (WLs) from among non-volatile WLs 106.1 through 106.n, corresponding volatile WLs from among volatile WLs 108.1 through 108.n, and corresponding bitlines (BLs) from among BLs 110.1 through 110.m. As described above, one or more of the memory cells 104.1.1 through 104.m.n can include one or more volatile memory cells and one or more non-volatile memory cells. For example, the memory cell 104.1.1 is coupled to the non-volatile WL 106.1 and the volatile WL 108.1 with the non-volatile WL 106.1 and the volatile WL 108.1 being characterized as forming a WL pair. As to be described in further detail below, these memory cells can be specially purposed to perform volatile and non-volatile memory functions. Exemplary embodiments for one or more of the memory cells 104.1.1 through 104.m.n are to be described in further detail below.

DETAILED DESCRIPTION—EXEMPLARY
MEMORY CELLS OF THAT CAN BE
IMPLEMENTED WITHIN THE EXEMPLARY
MEMORY STORAGE DEVICE

Figure 2:
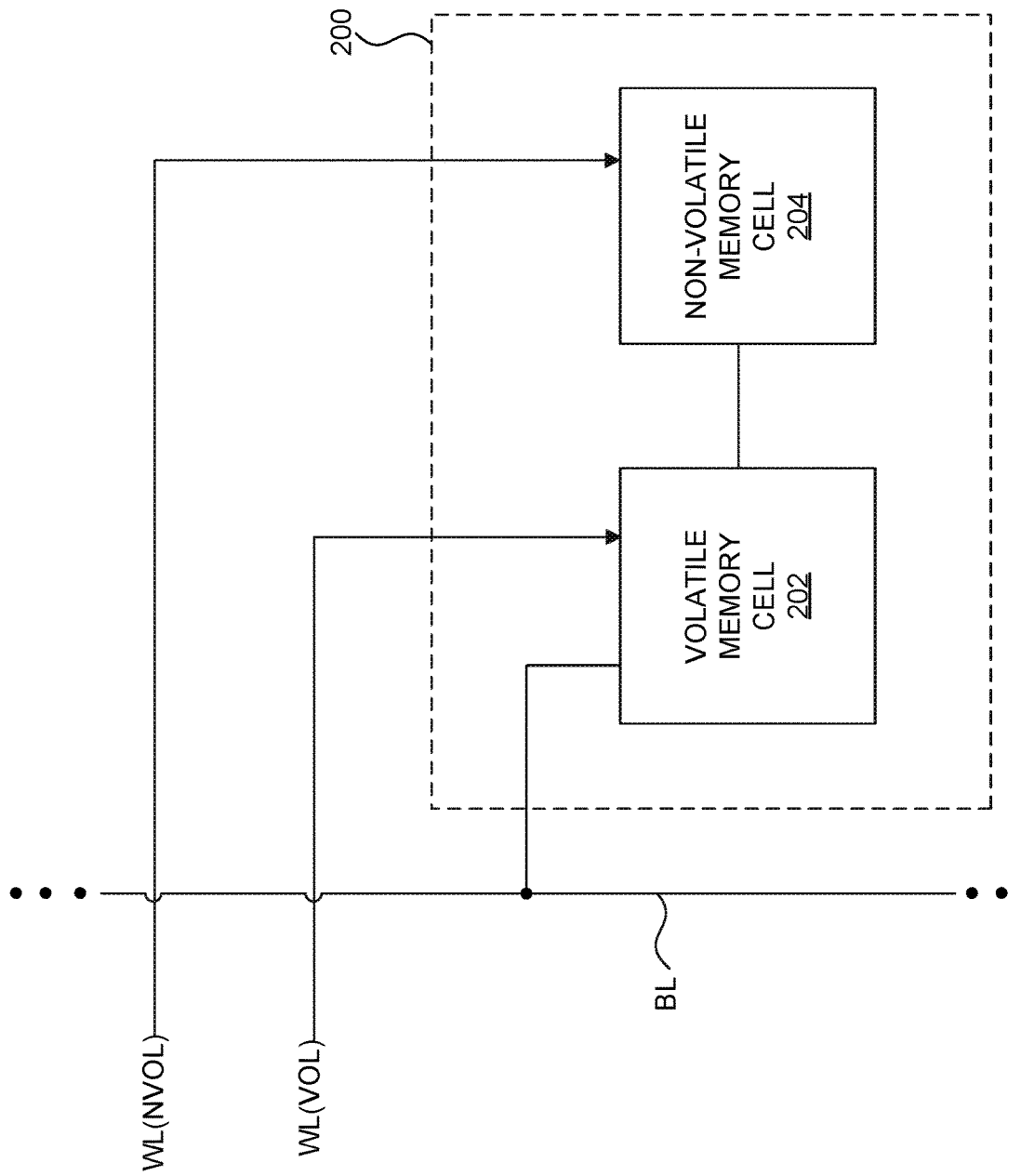
FIG. 2 illustrates a block diagram of a first exemplary memory cell that can be implemented within the exemplary memory storage device according to an exemplary embodiment of the present disclosure.

FIG. 2 illustrates a block diagram of a first exemplary memory cell that can be implemented within the exemplary memory storage device according to an exemplary embodiment of the present disclosure. A memory cell 200 from among a memory storage device, such as the memory storage device 100 to provide an example, can include one or more volatile memory cells and/or one or more non-volatile memory cells. As illustrated in FIG. 2, the memory cell 200 includes a volatile memory cell 202 and a non-volatile memory cell 204. The memory cell 200 can represent an exemplary embodiment of one or more of the memory cells 104.1.1 through 104.m.n as described above in FIG. 1.

In the exemplary embodiment illustrated in FIG. 2, the volatile memory cell 202 represents a memory cell which maintains its data while powered. In an exemplary embodiment, the one or more volatile memory cells can be implemented as dynamic random-access memory (DRAM), static random-access memory (SRAM), and/or non-volatile random-access memory (NVRAM), often referred to as a flash memory, configurations to provide some examples. However, those skilled in the relevant art(s) will recognize the volatile memory cell 202 can be implemented using other well-known volatile topologies without departing from the spirit and scope of the present disclosure. Generally, the non-volatile memory cell 204 is deactivated, or turn-off, and/or decoupled from the volatile memory cell 202 during operation of the volatile memory cell 202. As illustrated in FIG. 2, the volatile memory cell 202 and the non-volatile memory cell 204 are coupled to a volatile wordline, denoted as WL(VOL), and a non-volatile wordline, denoted as WL(NVOL), respectively. The WL(NVOL) and the WL(VOL) can represent exemplary embodiments of one or more of the non-volatile WLs 106.1 through 106.n and one or more of the volatile WLs 108.1 through 108.n, respectively, as described above in FIG. 1. In the exemplary embodiment illustrated in FIG. 2, the WL(NVOL) can be de-asserted, for example, set to a logical zero or a logical one depending upon implementation of the non-volatile memory cell 204, to deactivate the non-volatile memory cell 204 while accessing the volatile memory cell 202 using the WL(VOL).

In the exemplary embodiment illustrated in FIG. 2, the volatile memory cell 202 can operate in a volatile write mode of operation or in a volatile read mode of operation and can switch between these modes of operation. In an exemplary embodiment, the volatile memory cell 202 can be implemented as a random-access memory (RAM) storage device to provide an example. The RAM storage device can be implemented in a dynamic random-access memory (DRAM), a static random-access memory (SRAM), and/or a non-volatile random-access memory (NVRAM), often referred to as a flash memory, configuration to provide some examples. In the volatile write mode of operation, the WL(NVOL) can be de-asserted, for example, set to a logical zero or a logical one depending upon implementation of the non-volatile memory cell 204, to deactivate the non-volatile memory cell 204 and the WL(VOL) can be asserted, for example, set to a logical one or a logical zero depending upon implementation of the volatile memory cell 202, to access the volatile memory cell 202 to write data from a BL into the volatile memory cell 202. The BL as illustrated in FIG. 2 can represent an exemplary embodiment of one or more of the BLs 110.1 through 110.m as described above in FIG. 1. Similarly, the WL(NVOL) can be de-asserted to deactivate the non-volatile memory cell 204 and the WL(VOL) can be asserted to access the volatile memory cell 202 to read data from the volatile memory cell 202 onto the BL in the volatile read mode of operation.

In the exemplary embodiment illustrated in FIG. 2, the non-volatile memory cell 204 can operate in a non-volatile write, or program, mode of operation or in a non-volatile read mode of operation and can switch between these modes of operation. In an exemplary embodiment, the non-volatile memory can be implemented as a read-only memory (ROM) storage device to provide an example. The ROM storage device can be implemented as a programmable read-only memory (PROM), or one-time programmable ROM (OTP), an erasable programmable read-only memory (EPROM) or an electrically erasable programmable read-only memory (EEPROM). For example, the non-volatile memory cell 204 cell can be implemented using an anti-fuse to implement the programmable read-only memory (PROM), or the one-time programmable ROM (OTP). Herein, the term "anti-fuse" refers to a passive electrical component that is normally in a non-conductive, or high resistance, state, and which can be changed to a conductive, or low resistance state. In the non-volatile write, or program, mode of operation, the WL(VOL) is asserted to access the non-volatile memory cell 204. Thereafter, a programming voltage, also referred to as a thin gate oxide breakdown voltage is applied to the WL(NVOL) to cause the anti-fuse to change from the non-conductive, or high resistance, state, to the conductive, or low resistance state to program the anti-fuse to store a logical one. Otherwise, the anti-fuse, when un-programmed, stores a logical zero. In an exemplary embodiment, the anti-fuse can be implemented as split-channel anti-fuse having a n-type metal-oxide-semiconductor field-effect (NMOS) transistor with a source region, a diffusion region, a polysilicon gate region, and a variable gate oxide region. In this exemplary embodiment, the variable gate oxide region underneath the polysilicon gate region can include a thick gate oxide region and a thin gate oxide region, wherein the thin gate oxide region acts as a localized breakdown voltage zone for forming a conductive channel from the polysilicon gate region through the thin gate oxide region by applying the programming voltage. In another exemplary embodiment, the BL is set to a logical zero, the WL(VOL) is asserted is form a signal pathway from the non-volatile memory cell 204 to the BL effectively coupling the non-volatile memory cell 204 to the BL, and the programming voltage is applied to the WL(NVOL) to cause the anti-fuse to change from the non-conductive, or high resistance, state, to the conductive, or low resistance state. Otherwise, in the non-volatile read mode of operation, the WL(VOL) is asserted to is form the signal pathway from the non-volatile memory cell 204 to the BL and the WL(NVOL) is asserted to access the non-volatile memory cell 204 to pass a logical value stored in the non-volatile memory cell 204 through the volatile memory cell 202 onto the BL. When the anti-fuse is programmed as described above, the anti-fuse operates in the conductive, or the low resistance state, passing the WL(NVOL). Otherwise, when the anti-fuse is not programmed as described above, the anti-fuse operates in the non-conductive, or the high resistance state, and does not pass the WL(NVOL) onto the BL.

In some situations, data stored in the non-volatile memory cell 204 can be directly written into the volatile memory cell 202. In these situations, the WL(NVOL) is asserted to access the non-volatile memory cell 204 to read the logical value stored in the non-volatile memory cell 204 onto the volatile memory cell 202 in the non-volatile read mode of operation. In an exemplary embodiment, the memory cell 200 can be implemented within a memory storage device of a portable electronic device. These portable electronic devices often load data from non-volatile memory cells into volatile memory cells, for example, upon powering up. For example, the portable electronic devices often store data necessary for basic input/output system (BIOS), boot up, reading and writing to peripheral devices, basic data management and the software for basic processes for certain utilities into the non-volatile memory cells. Conventionally, portable electronic devices often include separate non-volatile memory storage devices and volatile memory storage devices which requires a significant amount of time to transfer data stored in non-volatile memory storage devices to the volatile memory storage devices. However, the memory cell 200 integrates the volatile memory cell 202 and the non-volatile memory cell 204 into a single integrated memory device. This direct writing of the data stored in the non-volatile memory cell 204 into the volatile memory cell 202 as described above significantly reduces time required to load data from the volatile memory cell 202 and the non-volatile memory cell 204 which can significantly speed up powering up of portable electronic devices having memory storage device with the memory cell 200.

Figure 3:
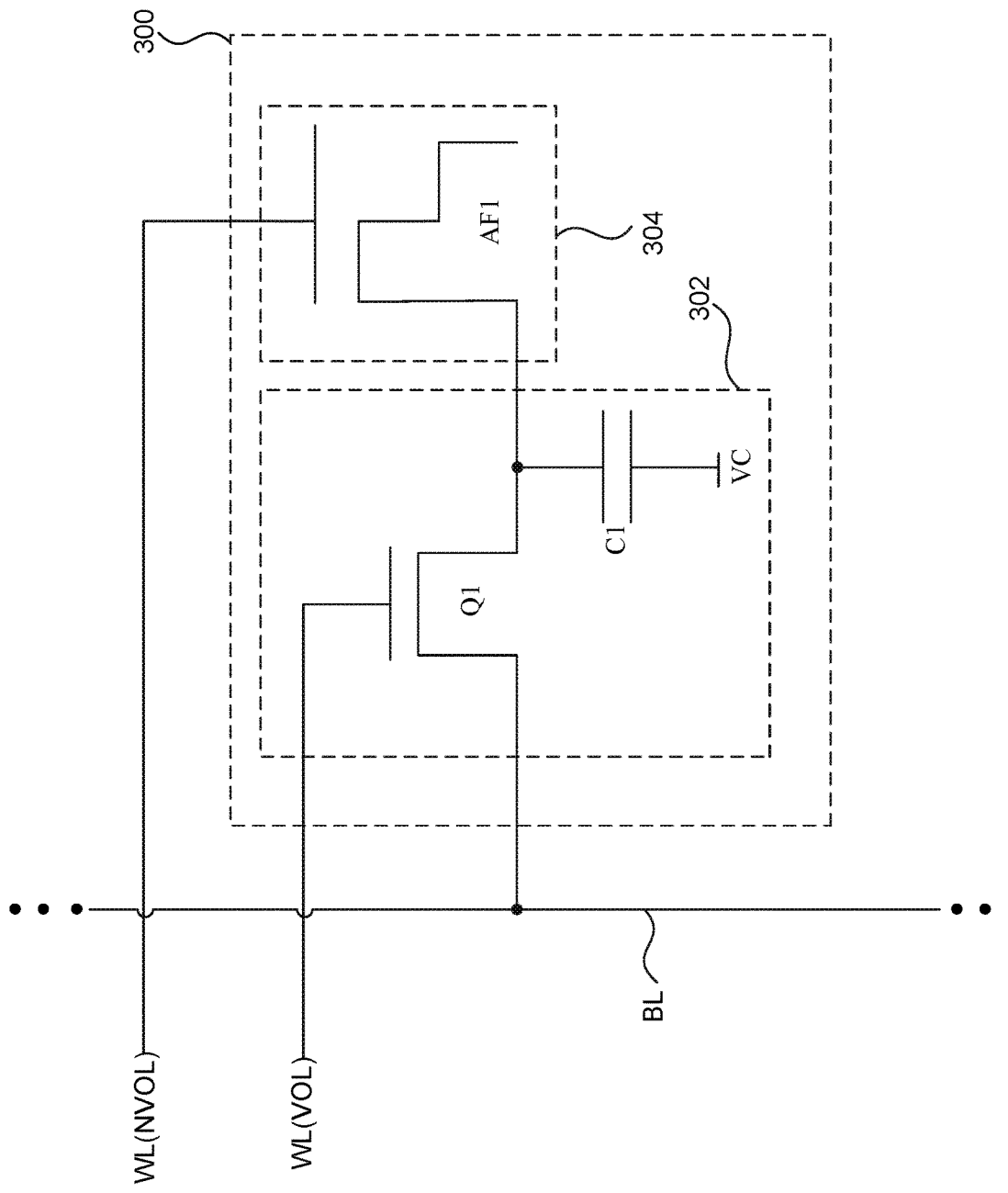
FIG. 3 illustrates a block diagram of a second exemplary memory cell that can be implemented within the exemplary memory storage device according to an exemplary embodiment of the present disclosure.

FIG. 3 illustrates a block diagram of a second exemplary memory cell that can be implemented within the exemplary memory storage device according to an exemplary embodiment of the present disclosure. A memory cell 300 from among a memory storage device, such as the memory storage device 100 to provide an example, can include one or more volatile memory cells and/or one or more non-volatile memory cells. As illustrated in FIG. 3, the memory cell 300 includes a volatile memory cell 302 and a non-volatile memory cell 304. The memory cell 300 can represent an exemplary embodiment of one or more of the memory cells 104.1.1 through 104.*m.n* as described above in FIG. 1 and/or the memory cell 200 as described above in FIG. 2.

In the exemplary embodiment illustrated in FIG. 3, the volatile memory cell 302 can operate in a volatile write mode of operation or in a volatile read mode of operation and can switch between these modes of operation in a substantially similar manner as the volatile memory cell 202 as described above in FIG. 2. As illustrated in FIG. 3, the volatile memory cell 302 includes an n-type metal-oxide-semiconductor field-effect (NMOS) transistor Q1 and a capacitor C1 arranged to form a dynamic random-access memory (DRAM). As illustrated in FIG. 3, the capacitor C1 is coupled to a common voltage Vc, for example a negative potential or ground potential. During the volatile write mode of operation and/or the volatile read mode of operation, the WL(NVOL) is set to a logical zero to deactivate the non-volatile memory cell 304 and the WL(VOL) is set to a logical one to activate, or turn-on, the NMOS transistor Q1 to activate or turn-on the volatile memory cell 302. In the volatile write mode of operation, data on the BL is written to the volatile memory cell 302. For example, in the volatile write mode of operation, when the data on the BL is at a logical one, this data charges the capacitor C1 to the logical one. In some situations, the capacitor C1 can be discharged by setting the BL to a logical zero before writing the data on the BL into the volatile memory cell 302. Otherwise, in this example, this data discharges the capacitor C1 to the logical zero when the data on the BL is at a logical zero in the volatile write mode of operation. In the volatile read mode of operation, data stored on the volatile memory cell 302 is read onto the BL. For example, in the volatile read mode of operation, when the capacitor C1 is charged to a logical one, this logical one is read onto the BL. Otherwise, in the volatile read mode of operation, when the capacitor C1 is discharged to a logical zero, this logical zero is read onto the BL.

In the exemplary embodiment illustrated in FIG. 3, the non-volatile memory cell 304 can operate in a non-volatile write, or program, mode of operation or in a non-volatile read mode of operation and can switch between these modes of operation in a substantially similar manner as the non-volatile memory cell 204 as described above in FIG. 2. As illustrated in FIG. 3, the non-volatile memory cell 304 includes an anti-fuse AF1. As described above in FIG. 2, the anti-fuse AF1 represents a passive electrical component that is normally in a non-conductive, or high resistance, state, and which can be changed to a conductive, or low resistance state. In the non-volatile write, or program, mode of operation the anti-fuse AF1 is programmed to store a logical one or remain unprogrammed to store a logical zero as described above in FIG. 2. During the non-volatile write, or program, mode of operation and/or the non-volatile read mode of operation, the WL(VOL) is set to a logical one to activate, or turn-on, the NMOS transistor Q1 to activate or turn-on the volatile memory cell 302 to form a signal pathway from the non-volatile memory cell 304 to the BL effectively coupling the non-volatile memory cell 304 to the BL. Thereafter, the programming voltage is applied to the WL(NVOL) of the anti-fuse AF1 to store a logical one in the non-volatile memory cell 304 when the BL is set to a logical zero as described above in FIG. 2. Otherwise, the anti-fuse AF1, when un-programmed, stores a logical zero as described above in FIG. 2. In the non-volatile read mode of operation, data stored on the non-volatile memory cell 304 is read into the volatile memory cell 302 and onto the BL. The anti-fuse AF1, when programmed, charges the capacitor C1 to the logical one when the WL(NVOL) is set to a logical one or otherwise the charge on the capacitor C1 remains at its current state when the anti-fuse AF1 is un-programmed and the WL(NVOL) is set to the logical one. In some situations, the capacitor C1 can be discharged by setting the BL to a logical zero before read the data from the non-volatile memory cell 304. Because, the non-volatile memory cell 304 is coupled to the BL, as described above, the charge stored in the capacitor C1, and hence the logical state of the capacitor C1, passes onto the BL.

Figure 4:
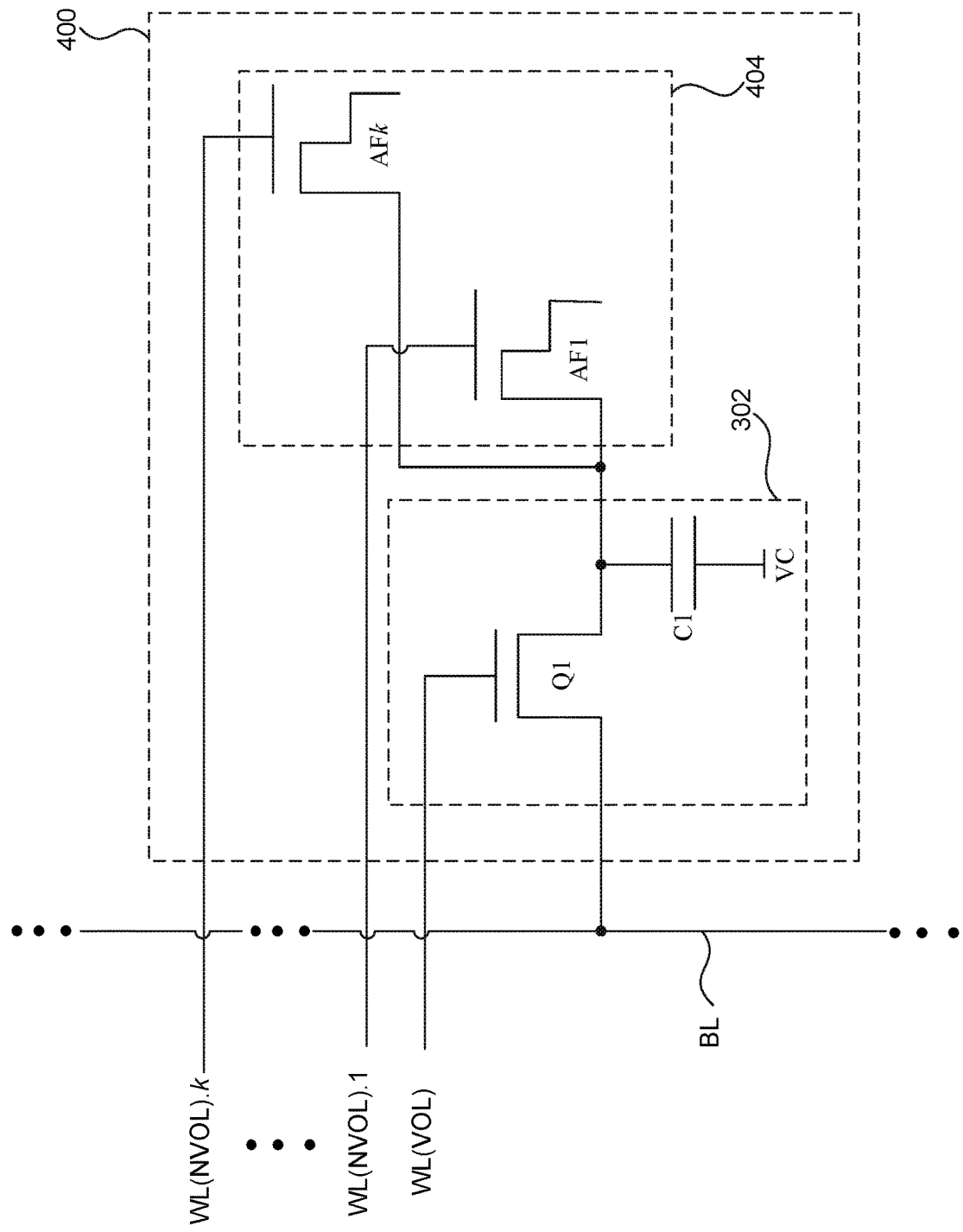
FIG. 4 illustrates a block diagram of a third exemplary memory cell that can be implemented within the exemplary memory storage device according to an exemplary embodiment of the present disclosure.

FIG. 4 illustrates a block diagram of a third exemplary memory cell that can be implemented within the exemplary memory storage device according to an exemplary embodiment of the present disclosure. A memory cell 400 from among a memory storage device, such as the memory storage device 100 to provide an example, can include one or more volatile memory cells and/or one or more non-volatile memory cells. As illustrated in FIG. 4, the memory cell 400 includes the volatile memory cell 302 and a non-volatile memory cell 404. The memory cell 400 can represent an exemplary embodiment of one or more of the memory cells 104.1.1 through 104.m.n as described above in FIG. 1 and/or the memory cell 200 as described above in FIG. 2. The memory cell 400 operates in a substantially similar manner as the memory cell 300 as described above; therefore, only differences between the memory cell 400 and the memory cell 300 are to be described in further detail below. In the exemplary embodiment illustrated in FIG. 4, the non-volatile memory cell 404 includes anti-fuses AF1 through AFk with each of the anti-fuses AF1 through AFk being coupled to a corresponding WL(NVOL) from among WL(NVOL).1 through WL(NVOL).k. The anti-fuses AF1 through AFk operate in a substantially similar manner as the anti-fuse AF1 as described above in FIG. 3. However, to access one or more anti-fuses from among the anti-fuses AF1 through AFk, one or more WL(NVOL)s corresponding to these anti-fuses are set to a logical one to activate, or turn-on, these anti-fuses while WL(NVOL)s corresponding to other anti-fuses from among the anti-fuses AF1 through AFk are set to a logical zero to deactivate, or turn-off, these anti-fuses.

Figure 5:
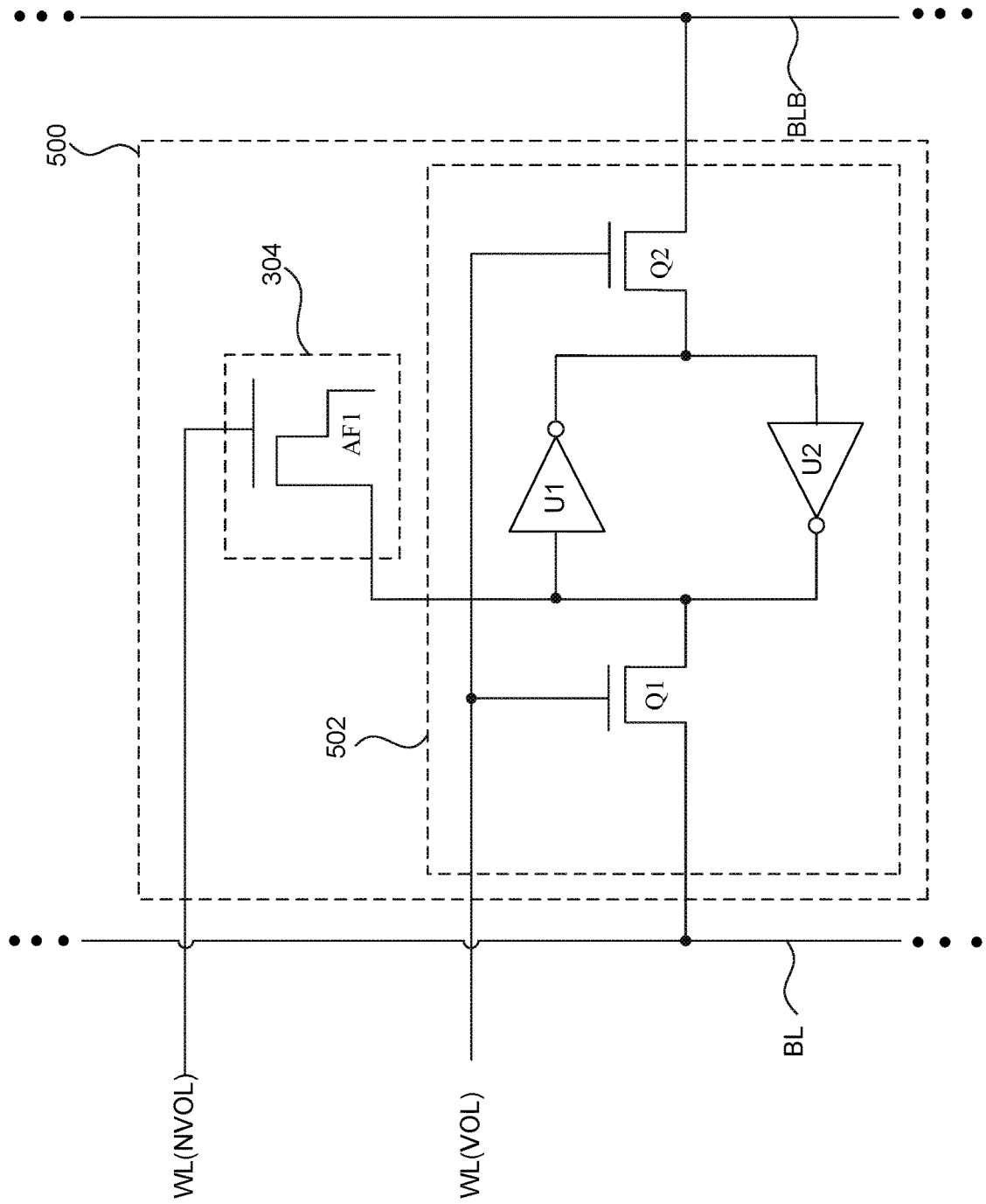
FIG. 5 illustrates a block diagram of a fourth exemplary memory cell that can be implemented within the exemplary memory storage device according to an exemplary embodiment of the present disclosure.

FIG. 5 illustrates a block diagram of a fourth exemplary memory cell that can be implemented within the exemplary memory storage device according to an exemplary embodiment of the present disclosure. A memory cell 500 from among a memory storage device, such as the memory storage device 100 to provide an example, can include one or more volatile memory cells and/or one or more non-volatile memory cells. As illustrated in FIG. 5, the memory cell 500 includes the non-volatile memory cell 304 and a volatile memory cell 502. The memory cell 500 can represent an exemplary embodiment of one or more of the memory cells 104.1.1 through 104.m.n as described above in FIG. 1 and/or the memory cell 200 as described above in FIG. 2.

In the exemplary embodiment illustrated in FIG. 5, the volatile memory cell 502 can operate in a volatile write mode of operation or in a volatile read mode of operation and can switch between these modes of operation in a substantially similar manner as the volatile memory cell 202 as described above in FIG. 2. As illustrated in FIG. 5, the volatile memory cell 502 includes n-type metal-oxide-semiconductor field-effect (NMOS) transistors Q1 and Q2 and logical inverters U1 and U2 arranged to form a static random-access memory (SRAM). The operation of a SRAM is well-known and will not be described in further detail. However, during the volatile write mode of operation and/or the volatile read mode of operation, the WL(NVOL) is set to a logical zero to deactivate the non-volatile memory cell 304 and the WL(VOL) is set to a logical one to activate, or turn-on, the NMOS transistors Q1 and Q2 to activate or turn-on the volatile memory cell 502. In the volatile write mode of operation, data on the BL and a complement of the data on BLB is written to the volatile memory cell 502. In the volatile read mode of operation, data stored on the volatile memory cell 502 is read onto the BL and the BLB. In the exemplary embodiment illustrated in FIG. 5, the non-volatile memory cell 304 can operate in a non-volatile write, or program, mode of operation or in a non-volatile read mode of operation and can switch between these modes of operation in a substantially similar manner as the non-volatile memory cell 304 as described above in FIG. 3. Moreover, during the non-volatile write, or program, mode of operation and/or the non-volatile read mode of operation, the WL(VOL) is set to a logical one to activate, or turn-on, the NMOS transistors Q1 and Q2 to activate or turn-on the volatile memory cell 502 to couple the non-volatile memory cell 304 to the BL and the BLB.

DETAILED DESCRIPTION—EXEMPLARY FABRICATION OF THE SECOND EXEMPLARY MEMORY CELL

Figure 6:
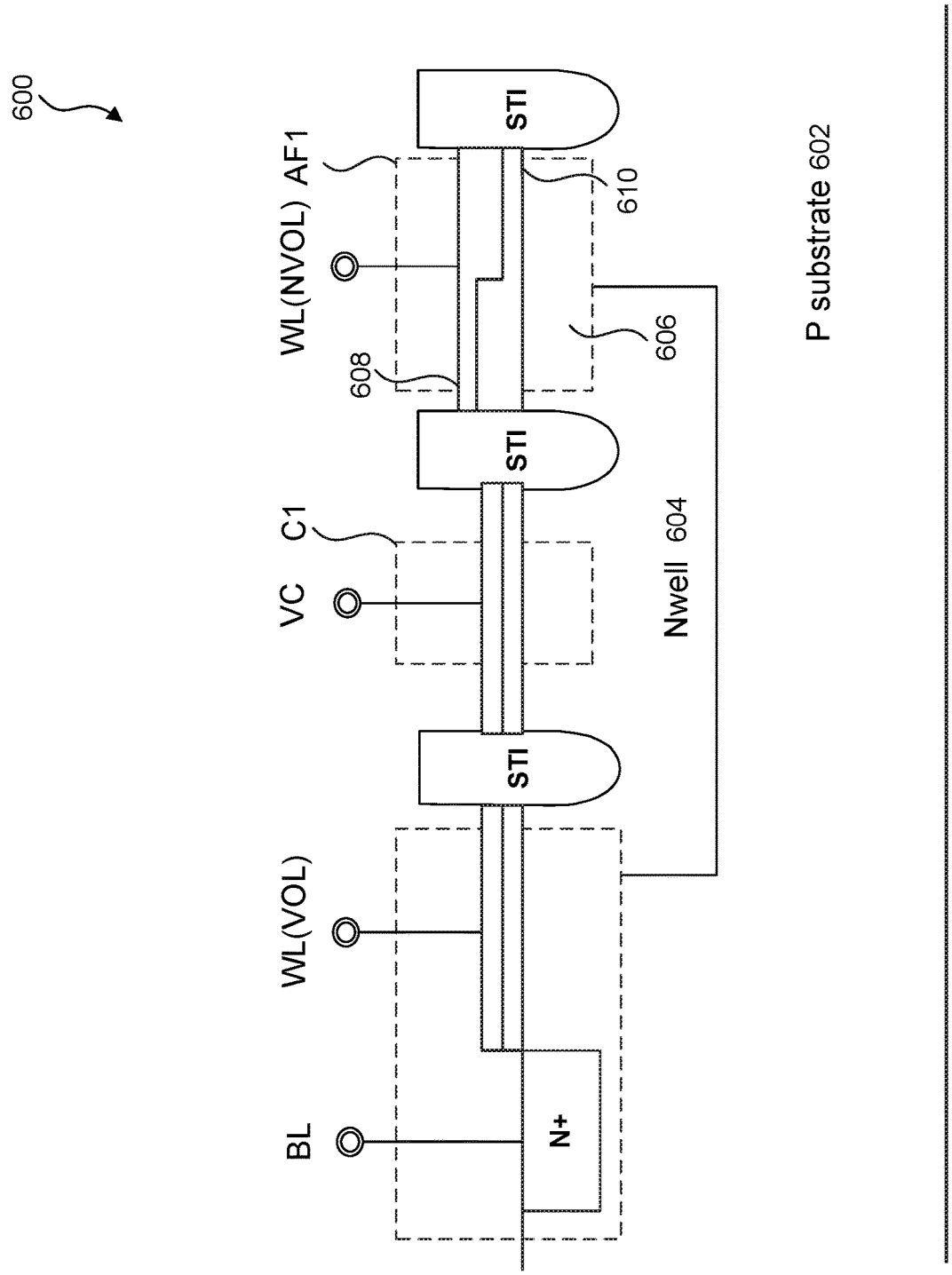
FIG. 6 illustrates a cross-sectional view of the second exemplary memory cell that can be implemented within the exemplary memory storage device according to an exemplary embodiment of the present disclosure.

FIG. 6 illustrates a cross-sectional view of the second exemplary memory cell that can be implemented within the exemplary memory storage device according to an exemplary embodiment of the present disclosure. As described in FIG. 3 above, the memory cell 300 includes the volatile memory cell 302, having the NMOS transistor Q1 and the capacitor C1, and the non-volatile memory cell 304, having the anti-fuse AF1. FIG. 6 illustrates an exemplary cross-sectional view 600 of the NMOS transistor Q1, the capacitor C1, and the anti-fuse AF1 formed within and/or onto a semiconductor substrate 602 of p-type material. The p-type material includes impurity atoms of an acceptor type, such as, but not limited to, boron or aluminum to provide some examples, that are capable of accepting an electron.

In the exemplary embodiment illustrated in FIG. 6, the NMOS transistor Q1 includes an N+ region forming a source region of the NMOS transistor Q1, a polysilicon region and an oxide region forming a gate region of the NMOS transistor Q1, and an Nwell region 604 forming a drain region of the NMOS transistor Q1. The N+ region represents a heavily doped region of n-type material. The n-type material includes impurity atoms of a donor type, such as, but not limited to, phosphorus, arsenic, or antimony to provide some examples, that are capable of donating an electron with the "+" indicating that the N+ region is implanted with a higher carrier concentration than a region not designated by a "+." For instance, the N+ region generally has a greater number of excess carrier electrons than the Nwell region 604. As illustrated in FIG. 6, an anode of the capacitor C1 is formed within the Nwell region 604 and a cathode of the capacitor C1 is coupled to the common voltage Vc as illustrated in FIG. 3 above. In an exemplary embodiment illustrated n FIG. 6, a gate oxide region between the anode and the cathode of the capacitor C1 forms a dielectric region for the capacitor C1. This gate oxide region can be implemented using a dielectric material, such as $SiO_2$, though any suitable material may be used as will be apparent to those skilled in the relevant art(s) without departing from the spirit and scope of the present disclosure.

As additionally illustrated in FIG. 6, the anti-fuse AF1 is implemented as a NMOS transistor with a variable gate oxide. In the exemplary embodiment illustrated in FIG. 6, the anti-fuse AF1 includes a source region 606, a polysilicon gate region 608, and a variable gate oxide region 610. In this exemplary embodiment, has no drain region. As illustrated in FIG. 6, the variable gate oxide region 610 underneath the polysilicon gate region 608 can include a thick gate oxide region and a thin gate oxide region, wherein the thin gate oxide region acts as a localized breakdown voltage zone for forming a conductive channel from the polysilicon gate region 608 to the P substrate region 602 by applying the programming voltage on the WL(NVOL) as described above in FIG. 2.

DETAILED DESCRIPTION—TECHNOLOGY SUPPORT GENERAL COMPUTER EXPLANATION

FIGS. 7A, 7B and 7C are simplified block diagrams of a computer system suitable for use with embodiments of the technology, as well as circuit design and circuit embodiments of the technology. The memory array 102 as described above can be implemented in hardware, firmware, software, or any combination thereof. The discussion of FIGS. 7A, 7B and 7C to follow describes computer system 710 that can be used for these implementations.

In FIG. 7A, computer system 710 typically includes at least one computer or processor 714 which communicates with a number of peripheral devices via bus subsystem 712. Typically, the computer can include, or the processor can be, any of a microprocessor, graphics processing unit, or digital signal processor, and their electronic processing equivalents, such as an Application Specific Integrated Circuit ('ASIC') or Field Programmable Gate Array ('FPGA'). The terms 'processor' and 'computer' are further defined below. These peripheral devices may include a storage subsystem 724, comprising a memory subsystem 726 and a file storage subsystem 728, user interface input devices 722, user interface output devices 720, and a network interface subsystem 716. The input and output devices allow user interaction with computer system 710.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine capable of executing instructions (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces coupled to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the present disclosure are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions to perform any one or more of the sets of instructions discussed herein. Due to the ever-changing nature of computers and networks, the description of computer system 710 depicted in FIG. 7A is intended only as one example for purposes of illustrating the preferred embodiments. Many other configurations of computer system 710 are possible having more or less components than the computer system depicted in FIG. 7A.

Network interface subsystem 716 provides an interface to outside networks, including an interface to communication network 718, and is coupled via communication network 718 to corresponding interface devices in other computer systems or machines. Communication network 718 may comprise many interconnected computer systems, machines and communication links. These communication links may be wireline links, optical links, wireless links, or any other devices for communication of information. Communication network 718 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 722 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term 'input device' is intended to include all possible types of devices and ways to input information into computer system 710 or onto communication network 718. User interface input devices typically allow a user to select objects, icons, text and the like that appear on some types of user interface output devices, for example, a display subsystem.

User interface output devices 720 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term 'output device' is intended to include all possible types of devices and ways to output information from computer system 710 to the user or to another machine or computer system.

Memory subsystem 726 typically includes a number of memories including a main random-access memory ('RAM') 730 (or other volatile storage device) for storage of instructions and data during program execution and a read only memory (ROM') 732 in which fixed instructions are stored. File storage subsystem 728 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 728.

Bus subsystem 712 provides a device for letting the various components and subsystems of computer system 710 communicate with each other as intended. Although bus subsystem 712 is shown schematically as a single bus, alternative embodiments of the bus subsystem may use multiple busses. For example, RAM-based main memory can communicate directly with file storage systems using Direct Memory Access (DMA') systems.

FIG. 7B depicts a memory 740 such as a non-transitory, computer readable data and information storage medium associated with file storage subsystem 728, and/or with network interface subsystem 716, and can include a data structure specifying a circuit design. The memory 740 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 7C signifies an integrated circuit 790 created with the described technology that includes one or more cells selected, for example, from a cell library.

DETAILED DESCRIPTION—TECHNOLOGY SUPPORT HARDWARE/SOFTWARE EQUIVALENCE

As described above, Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term 'processor' can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. No scientific evidence exists that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMs) or microprocessors. A module is configured to process data and information, typically using a sequence of transformations (also referred to as 'operations') applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The 'substance' of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term 'software application' signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the C programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software or has an interface device that receives the software over a network. This process is discussed in the General Computer Explanation section.

DETAILED DESCRIPTION—TECHNOLOGY SUPPORT EDA SYSTEM/WORKFLOW EXPLANATION

FIG. 8 illustrates various processes 800 performed in the design, verification and fabrication of an item of manufacture such as an integrated circuit using software tools with a computer, and possibly special hardware-assisted tools, to transform and verify design data and instructions that represent the integrated circuit. The term 'EDA' signifies the term 'Electronic Design Automation'. These processes start with the creation of a product idea 810 with information supplied by a designer, information which is transformed during a process to create an item of manufacture (referred to herein as a design or device) that uses an EDA software tool 812, which may also be signified herein as EDA software, as a design tool, or a verification tool. When the design is finalized, it can be taped-out 834, which typically is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed, which result in the finished integrated circuit 840 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language ('HDL') such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level ('RTL') description, a gate-level description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, which is much used for detailed descriptions of analog-based circuits.

A design process that uses an EDA software tool 812 includes processes 814 to 832, which are described below. This design flow description is for illustration purposes only and is not meant to limit the present disclosure. For example, an actual integrated circuit design may require a designer to perform the design operations in a different sequence than the sequence described herein.

During system design 814, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 816, modules in the circuit are specified in one or more hardware description languages, or HDLs, and the design in HDL is checked for functional accuracy, that is, to match the requirements of the specification of the circuit or system being designed to ensure that the design produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS, Vera, Designware, Magellan, Formality, ESP and Leda products. Exemplary emulator and prototyping products also available from Synopsys that can be used at this state include: Zebu® and Protolink® (® signifies 'Registered Trademark').

During synthesis and design for test 818, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification 820, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 822, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 824, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 826, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 828, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 830, geometric manipulations of the layout are performed to improve manufacturability of the design. Exemplary EDA software products from Synopsys, Inc. of Mountain View, Calif. that can be used at this stage include: Proteus products.

During tape-out, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 832, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above-mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 812.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

DETAILED DESCRIPTION—SEMANTIC SUPPORT

The signifier 'commercial solution' signifies, solely for the following paragraph, an engineering domain-specific (and thus non-preemptive—see Bilski): electronic structure, a process for a specified machine, a manufacturable circuit (and their Church-Turing equivalents) or a composition of matter that applies science and/or technology in commerce to solve a technical problem.

The signifier 'abstract' (when used in a patent claim for any enabled embodiments disclosed herein for a new commercial solution that is a scientific use of one or more laws of nature {see Benson}, and that solves a problem of technology {see Diehr} used in commerce—or improves upon an existing commercial solution {see Diehr})—is precisely defined by the inventor(s) {see MPEP 2111.01 ($9^{th}$ edition, Rev. 08.2017)} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is 'difficult to understand' {see Merriam-Webster definition for 'abstract'} how the commercial solution differs from equivalent prior art solutions; or b) a new commercial solution is 'abstract' if it is obvious, that is, if the existing prior art includes at least one analogous prior art solution {see KSR}, or the existing prior art includes at least two prior art publications that can be combined {see Alice} by a skilled person {often referred to as a 'PHOSITA', see MPEP 2141-2144 ($9^{th}$ edition, Rev. 08.2017)} to be equivalent to the new commercial solution, and is thus unpatentable under 35 U.S.C. 103, for example, because it is 'difficult to understand' how the new commercial solution differs from a PHOSITA-combination/-application of the existing prior art; or c) a new commercial solution is 'abstract' if it is not disclosed with a description that enables its praxis, either because insufficient guidance exists in the description, or because only a generic implementation is described {see Mayo} with unspecified components, parameters or functionality, so that a PHOSITA is unable to instantiate an embodiment of the new solution for use in commerce, without, for example, requiring special programming {see Katz} (or, e.g., circuit design) to be performed by the PHOSITA, and is thus unpatentable under 35 U.S.C. 112, for example, because it is 'difficult to understand' how to use in commerce any embodiment of the new commercial solution.

DETAILED DESCRIPTION—DEFINITIONS

As used herein, the semiotic function RUD(t, p1, p2, . . . ) signifies that a skilled person can obtain, if needed for progressing the useful arts, a reasonably useful definition of the signifier 't' that comprises the union of definitions of T in one or more U.S. Patents and U.S. Patent Applications 'p1', 'p2', etc. For example, 'RUD(substantially,9532624)' signifies that a skilled person can obtain a reasonably useful definition of 'substantially' as it is defined in U.S. Pat. No. 9,532,624.

DEFINITIONS: RUD(substantially,9532624).

DETAILED DESCRIPTION—CONCLUSION

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof, solve any problems disclosed herein, and without limitation to the scope of the claims. When an embodiment of the disclosure comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein signify the principles of the disclosure and its useful application, thereby enabling others skilled in the art to understand how various embodiments and variations are suited to the particular uses signified.

The foregoing Detailed Description of innovations, embodiments, and/or examples of the disclosure have been provided for the purposes of illustration and description. It is not intended to be exhaustive nor to limit the claimed inventions to the precise forms described but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed:

1. A memory storage device, comprising:
    a plurality of memory cells arranged in a plurality of rows and a plurality of columns, memory cells from among the plurality of rows being coupled to corresponding wordlines from among a plurality of wordlines and memory cells from among the plurality of columns being coupled to corresponding bitlines from among a plurality of bitlines,
    wherein at least one memory cell from among the plurality of memory cells comprises:
        a non-volatile memory cell, coupled to a first group of wordlines from among the plurality of wordlines and a corresponding bitline from among the plurality of bitlines, configured to maintain a plurality of first data bits while not powered, the non-volatile memory cell including a plurality of anti-fuses configured to store the plurality of first data bits, each anti-fuse from among the plurality of anti-fuses being coupled to a corresponding wordline from among the first group of wordlines; and
        a volatile memory cell, coupled to a second wordline from among the plurality of wordlines and the corresponding bitline, configured to maintain a second data bit when powered.

2. The memory storage device of claim 1, wherein the memory storage device is further configured to:
    write a corresponding first data bit from among the plurality of first data bits into a corresponding anti-fuse from among the plurality of anti-fuses in response to applying a programming voltage on a corresponding first wordline from among the first group of wordlines; and
    read the corresponding first data bit from the corresponding anti-fuse in response to asserting the corresponding first wordline and the second wordline.

3. The memory storage device of claim 2, wherein the memory storage device is further configured to:
    write the corresponding first data bit into the corresponding anti-fuse in response to:
        asserting the second wordline to activate the volatile memory cell to form a signal pathway between the corresponding anti-fuse and the corresponding bitline to couple the corresponding anti-fuse to the corresponding bitline, and
        de-asserting the corresponding bitline; and
    read the corresponding first data bit from the corresponding anti-fuse in response to asserting the second wordline to form the signal pathway to couple the corresponding anti-fuse to the corresponding bitline.

4. The memory storage device of claim 1, wherein the memory storage device is further configured to:
    write the second data bit from the corresponding bitline into the volatile memory cell in response to de-asserting the first group of wordlines to deactivate the plurality of anti-fuses and asserting the second wordline; and read the second data bit from the volatile memory cell onto the corresponding bitline in response to de-asserting the first group of wordlines to deactivate the plurality of anti-fuses and asserting the second wordline.

5. The memory storage device of claim 1, wherein the plurality of anti-fuses is configured and arranged to form a read-only memory (ROM).

6. The memory storage device of claim 1, wherein each anti-fuse from among the plurality of anti-fuses is configured to change from a non-conductive state to a conductive state in response to applying a programming voltage on a corresponding first wordline from among the first group of wordlines.

7. The memory storage device of claim 6, wherein each anti-fuse from among the plurality of anti-fuses comprises:
a polysilicon gate region;
a first gate oxide region; and
a second gate oxide region, the first gate oxide region being thicker than the second gate oxide region,
wherein the programming voltage, when applied on the corresponding first wordline, forms a conductive channel from the polysilicon gate region through the second gate oxide region.

8. The memory storage device of claim 1, wherein the volatile memory cell comprises:
a random-access memory (RAM) storage device.

9. The memory storage device of claim 8, wherein the RAM comprises:
a dynamic random-access memory (DRAM); or
a static random-access memory (SRAM).

10. A memory cell from among a memory array of a memory storage device, the memory cell comprising:
a dynamic random-access memory (DRAM) cell, including a transistor and a capacitor, configured to:
charge and/or discharge the capacitor in response to assertion of a first wordline to activate the transistor to write a first data bit from a bitline onto the capacitor; and
read charge stored on the capacitor in response to assertion of the first wordline to read a second data bit from the capacitor onto the bitline; and
a one-time programmable read-only memory (OTP-ROM) cell, including a plurality of antifuses, configured to:
be programmed to write a plurality of third data bits into the plurality of antifuses in response to application of a programming voltage on corresponding second wordlines from among plurality of second wordlines; and
read charge stored on the capacitor in response to assertion of the corresponding second wordlines to activate corresponding antifuses from among the plurality of anti-fuses to read a plurality of fourth data bits from the plurality of antifuses onto the bitline.

11. The memory cell of claim 10, wherein the plurality of second wordlines is de-asserted to de-activate the plurality of antifuses to write the first data bit from the bitline onto the capacitor and to read the second data bit from the capacitor onto the bitline.

12. The memory cell of claim 10, wherein the plurality of antifuses is further configured to be programmed to write the plurality of third data bits in response to assertion of the first wordline to activate the transistor and de-assertion of the bitline.

13. The memory cell of claim 10, wherein the plurality of antifuses is further configured to read the charge stored on the capacitor in response to assertion of the first wordline to activate the transistor to form a signal pathway between the plurality of antifuses and the bitline.

14. The memory cell of claim 10, wherein the plurality of second wordlines is de-asserted to deactivate the plurality of antifuses cell while the DRAM cell is writing the first data bit from the bitline onto the capacitor and reading the second data bit from the capacitor onto the bitline.

15. The memory cell of claim 10, wherein each antifuse from among the plurality of antifuses comprises:
a polysilicon gate region;
a first gate oxide region; and
a second gate oxide region, the first gate oxide region being thicker than the second gate oxide region,
wherein the programming voltage, when applied on a corresponding second wordline from among the plurality of second wordlines, forms a conductive channel from the polysilicon gate region through the second gate oxide region.

16. A memory cell from among a memory array of a memory storage device, the memory cell comprising:
a volatile memory cell, coupled to a first wordline and a bitline, configured to:
write a first data bit from the bitline into a non-volatile memory cell in response to assertion of the first wordline; and
read a second data bit from the non-volatile memory cell onto the bitline in response to assertion of the first wordline; and
the non-volatile memory cell, coupled to a plurality of second wordlines and the bitline, configured to:
be programmed to write a plurality of third data bits into a plurality of antifuses in response to assertion of the first wordline to form a signal pathway between the plurality of antifuses and the bitline and application of a programming voltage on the plurality of second wordlines; and
read a plurality of fourth data bits from the plurality of antifuses onto the bitline in response to assertion of the first wordline to form the signal pathway and assertion of the plurality of second wordlines.

17. The memory cell of claim 16, wherein the plurality of second wordlines is de-asserted to deactivate the non-volatile memory cell while the volatile memory cell is writing the first data bit from the bitline into the volatile memory cell and reading the second data bit from the volatile memory cell onto the bitline.

18. The memory cell of claim 16, wherein the bitline is set to a logical zero while the non-volatile memory cell is programmed to write the plurality of third data bits into the non-volatile memory cell.

19. The memory cell of claim 16, wherein each anti-fuse from among the plurality of anti-fuses is configured to change from a non-conductive state to a conductive state in response to application of the programming voltage on a corresponding second wordline from among the plurality of second wordlines.

20. The memory cell of claim 16, wherein the volatile memory cell comprises:
   a dynamic random-access memory (DRAM); or
   a static random-access memory (SRAM).

* * * * *